United States Patent [19]
Ham et al.

[11] 3,890,632
[45] June 17, 1975

[54] STABILIZED SEMICONDUCTOR DEVICES AND METHOD OF MAKING SAME

[75] Inventors: William Edward Ham, Monmouth Junction; Doris Winifred Flatley, North Brunswick, both of N.J.

[73] Assignee: RCA Corp., New York, N.Y.

[22] Filed: Dec. 3, 1973

[21] Appl. No.: 420,783

[52] U.S. Cl. .................... 357/23; 357/49; 357/52; 357/56
[51] Int. Cl. .................... H01l 11/00
[58] Field of Search .................... 317/235

[56] References Cited

UNITED STATES PATENTS

| | | | |
|---|---|---|---|
| 3,394,037 | 7/1968 | Robinson | 317/235 |
| 3,409,812 | 11/1968 | Zuleeg | 317/235 |
| 3,486,892 | 12/1969 | Rosvold | 317/235 |
| 3,752,711 | 8/1973 | Kooi et al. | 317/235 |
| 3,789,504 | 2/1974 | Jaddam | 317/235 |
| 3,823,352 | 7/1974 | Pruniaux et al | 357/56 |

*Primary Examiner*—Michael J. Lynch
*Assistant Examiner*—E. Wojciechowicz
*Attorney, Agent, or Firm*—H. Christoffersen; A. I. Spechler

[57] ABSTRACT

Instabilities in the leakage current and threshold voltage of a field-effect transistor (FET) on an insulator, at both room temperature and after operation at relatively high temperatures (150°C), are substantially reduced by selectively doping edge regions adjacent to the transverse side surfaces of the channel region of the FET. The selective doping comprises implanting atoms into these edge regions, as by ion implantation or diffusion, to provide therein a carrier concentration of at least $5\times10^{16}cm^{-3}$ atoms of the opposite conductivity type to that of the source and drain regions of the FET.

5 Claims, 9 Drawing Figures

STABILIZED SEMICONDUCTOR DEVICES AND METHOD OF MAKING SAME

This invention relates generally to semiconductor devices and to a method of making same. More particularly, the invention relates to stabilized field-effect transistors on insulating substrates and to a method of making them.

Instabilities, such as excessive leakage current with zero gate voltage, of certain silicon-on-sapphire (SOS) field-effect transistors (FETs) have been noted. These instabilities were especially noticeable after the FETs were operated at temperatures in excess of about 150°C and were exhibited most frequently by N-channel SOS/FETs. Prior art N-channel SOS/FETs also frequently exhibited premature turn-on in addition to relatively high source-drain leakage currents.

The present novel semiconductor devices substantially overcome the aforementioned disadvantages. Briefly, one embodiment of the novel stabilized semiconductor device comprises a mesa of single-crystal semiconductor material on an insulating substrate. The mesa has side surfaces extending transversely from the substrate and a channel region between opposite side surfaces. Selectively doped edge regions of the channel region, adjacent to the opposite side surfaces, have more conductivity modifiers therein than the remainder of the channel region, whereby the threshold voltage in these doped regions is increased and leakage currents are decreased.

In another embodiment of the novel stabilized semiconductor device, the device comprises an N-channel FET wherein a mesa of silicon has a channel region between opposite side surfaces. Edge regions in the channel region, adjacent to the opposite side surfaces, are doped with a P type dopant in a carrier concentration of at least $5\times10^{16}cm^{-3}$.

The novel method of making the stabilized semiconductor FET devices comprises doping edge regions in a channel region, adjacent to opposite side surfaces of a mesa of semiconductive material, to provide therein a channel region with doped edge regions having a concentration of active carriers to raise the threshold voltage at the edge regions above that of the normally operating FET.

The novel stabilized semiconductor devices and method of making them will be described in conjunction with the accompanying drawings in which.

Figure 1:
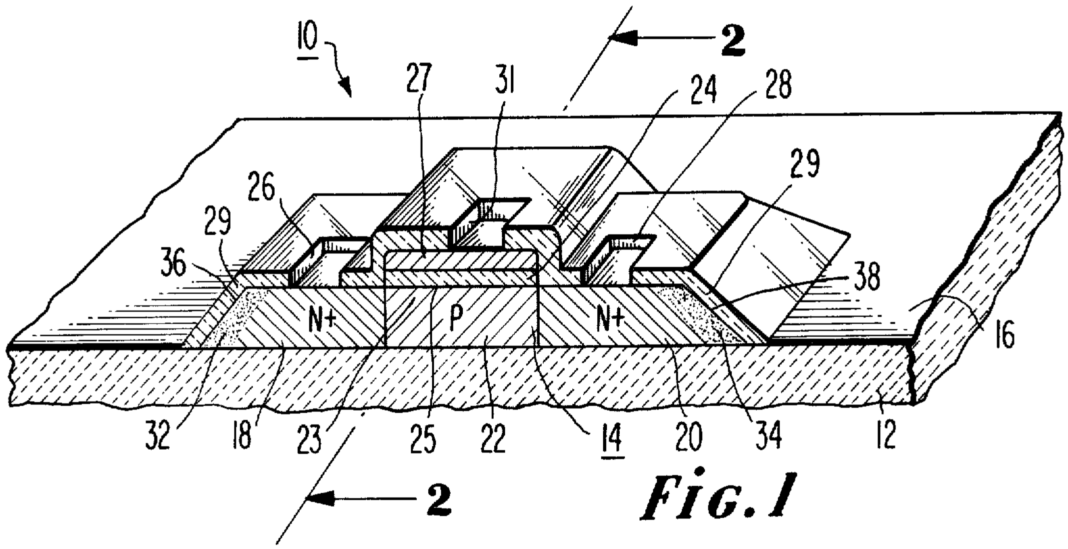
FIG. 1 is a perspective sectional view of an SOS/FET embodying the invention, taken along the line 1—1 of FIG. 2.
Figure 2:
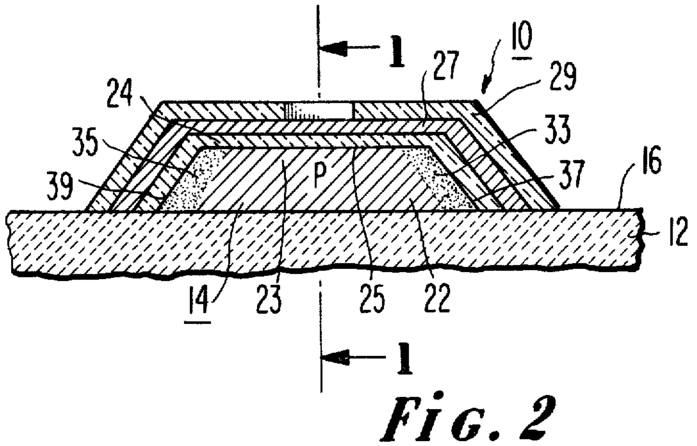
FIG. 2 is a vertical sectional view of the novel device illustrated in FIG. 1, taken along the line 2—2 of FIG. 1.

Referring now to FIGS. 1 and 2 of the drawing, there is shown one embodiment of a stabilized field-effect transistor (FET) 10. The FET 10 comprises a substrate 12 of electrically insulating material, such as sapphire or spinel, for example. An island, or mesa 14, of a layer of semicoonductor material, such as P type silicon germanium, or gallium arsenide, for example, is epitaxially deposited on a smooth flat surface 16 of the insulating substrate 12. The mesa 14 comprises two spaced-apart N+ type source and drain regions 18 and 20, respectively, separated by a P type channel region 22.

During the operation of the FET 10 in the enhancement mode, an N type channel is formed in the portion 23 of the channel region 22 adjacent the (top) surface 25 of the channel region 22 remote from the substrate 12. The channel region 22 is covered with a layer 24 of electrically insulating material, such as silicon dioxide or silicon nitride, for example. The insulating layer 24 is aligned with the channel region 22 and functions as a gate insulator. A gate electrode 27 of doped (phosphorus) polysilicon is deposited over the insulating layer 24 and aligned with the channel region 22. An insulating layer 29, such as of silicon dioxide, for example, is deposited over the source and drain regions 18 and 20 and also over the gate electrode 27. Three windows or openings 26, 28, and 31 are formed in the insulating layer 29 over the source and drain regions 18 and 20 and over the gate electrode 27, respectively, to provide means for making electrical contacts to these regions and to the gate electrode in a manner well known in the art.

An important feature of the novel FET 10 is the selective doping of edge regions 32, 33, 34, and 35 adjacent to the transverse edges, or side surfaces 36, 37, 38, and 39, respectively, of the FET 10.

The side surfaces 36–39 of the semiconductor mesa 14 extend transversely from the surface 16 of the insulating substrate 12; and the selective doping of the edge regions 32–35, adjacent to the transverse side surfaces 36–39, respectively, is carried out, preferably by ion implantation. The selective doping of the edge regions 32–35 can, however, be carried out by any other doping means known in the art. If the source and drain regions 18 and 20, respectively, of the FET 10 are of N type conductivity, the selective doping of the edge regions 32–35 is with conductivity modifiers of the opposite type, that is, with P type conductivity. The original (starting) concentration of carriers of the semiconductor mesa 14 may be in the neighborhood of between about $10^{14}cm^{-3}$.

In a preferred embodiment of the FET 10, wherein the FET 10 is an SOS/FET, the carrier concentration of the selectively doped edge regions 33 and 35 in the channel region 22 should be at least about $5\times10^{16}cm^{-3}$. Also, the selective doping of the edge regions 32–35 is always with a dopant material of an opposite conductivity type to that present in the source and drain regions 18 and 20 of the FET 10.

The structure of the novel stabilized FETs will be better understood from the following description of the novel method of making them.

Figure 3:
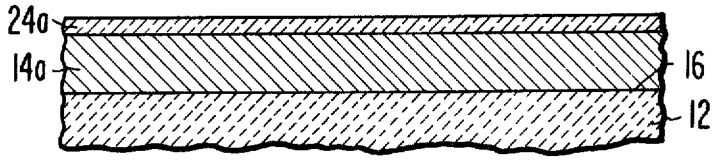
FIGS. 3–9 are diagrammatic views illustrating various steps of the process of manufacturing the novel stabilized semiconductor devices according to the invention.

Referring now to FIG. 3 of the drawing, there is shown the insulating substrate 12 of single crystal sapphire, for example, having the upper surface 16, a polished surface preferably substantially parallel to the (1102) crystallographic planes of the substrate 12. A semiconductor layer 14a of P type single crystal silicon, for example, is epitaxially grown on the surface 16 by the pyrolysis of silane at about 960°C in $H_2$ and has a (100) orientation in this example. The semiconductor layer 14a has a thickness of about 1 $\mu$m and a carrier concentration of between about $10^{15}cm^{-3}$ and $10^{16}cm^{-3}$.

An insulating layer 24*a* of silicon dioxide, or any other etch-resistant and conductivity-modifier impermeable material, which may have a thickness of between about 1000A and 2000A, is deposited on the semiconductor layer 14*a*. The insulating layer 24*a* may be deposited by any means known in the art, such as, for example, growing the layer 24*a* by oxidizing the semiconductor layer 14*a* at 900°C in steam, for examaple, (or at 940°C in wet oxygen).

Figure 4:
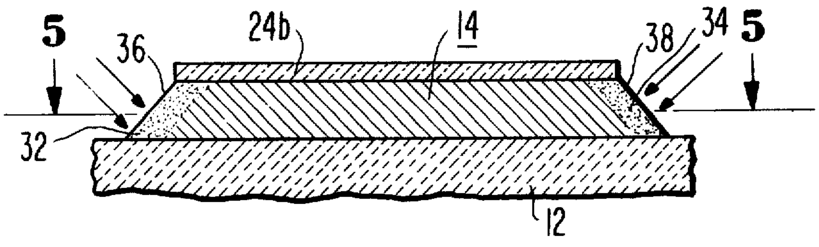

A portion of the insulating layer 24*a* is removed, as by employing photolithographic techniques and by etching with a buffered HF solution, leaving a remaining portion, insulating layer 24*b*, as shown in FIG. 4. The insulating layer 24*b* is an etch-resistant and conductivity-modifier impermeable mask for defining the mesa 14 of semiconductor material, in a manner well known in the art. The mesa 14 is defined, for example, by etching with a hot n-propanol KOH etching solution.

Figure 5:
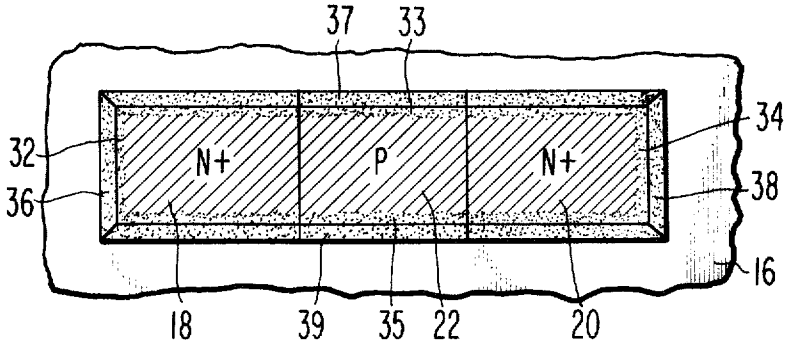

The mesa 14 has sloping transverse edges, or side surfaces 36–39, only the side surfaces 36 and 38 being visible in FIG. 4 (side surfaces 37 and 39 being shown in FIG. 2). The selective doping of the semiconductor mesa 14 is carried out preferably by the ion implantation of dopant atoms to provide the selectively doped edge regions 32–35, as shown in FIG. 5. A vertical dose of boron ions of between 1 and $2\times10^{13}cm^{-2}$ at 150 KeV implanted into the mesa 14 is an optimum compromise between stability and edge breakdown voltage for an N-channel FET of the type described. The dopant carriers implanted into the edge regions 32–35 are of the opposite (P type) conductivity type to that of the N+ source and drain regions 18 and 20, and they extend from the side surfaces 36–39 a distance of about one micron or less, as shown in FIG. 5.

In accordance with the novel FETs and method of making them, it is important that the doped edge regions 33 and 35 adjacent the opposite side surfaces 37 and 39, respectively, of the channel region 22 be selectively doped to provide a stabilized FET. The remaining selective doping of the side surfaces of the source and drain regions 18 and 20 does not materially affect the operation of the FET and is tolerated because extra processing operations to eliminate this selective doping would otherwise be necessary. Also, by doping all of the edge regions 32–35, one has a choice of the manner (direction) the FET is to be constructed in the mesa 14.

After the selective doping of the edge regions 32–35, the novel stabilized FET can be fabricated with either a doped polysilicon gate or a metal gate.

Figure 6:
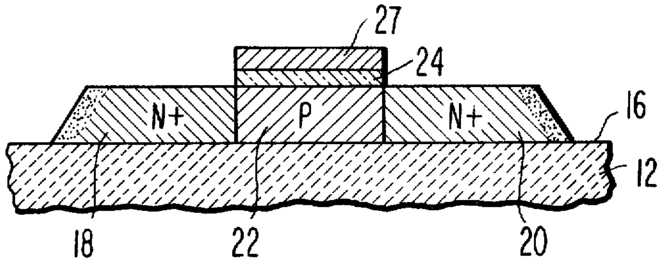

To make the FET 10 with a doped polysilicon gate electrode 27, as shown in FIG. 1, the gate electrode 27 of doped polysilicon is deposited by vapor deposition, over the silicon dioxide layer 24*b* (FIG. 4) and defined to align with a channel region, by photolithographic techniques well known in the art, and portions of the silicon dioxide layer 24*b* are also etched away, to provide the gate insulating layer 24, as shown in FIG. 6. Using the gate electrode 27 as an etch-resistant mask, the N+ source and drain regions 18 and 20 are formed by introducing N type dopants therein, as shown in FIG. 6. The N+ source and drain regions 18 and 20 can be formed by introducing phosphorus, for example, into the mesa 14 either in a diffusion furnace, for example, or by ion implantation, or from a doped oxide, as other examples. During this operation, the gate electrode 27 of doped polysilicon may be simultaneously doped to increase its conductivity.

Figure 7:
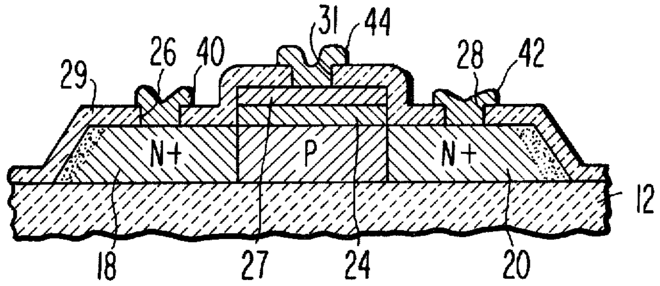

After the source and drain regions 18 and 20 are formed, the mesa 14 and the gate electrode 27 are covered with the insulating layer 29 of silicon dioxide, as shown in FIG. 7. Openings 26, 28, and 31 are formed in the insulating layer 29, by photolithographic techniques, for electrical contacts 40, 42, and 44 to the source and drain regions 18 and 20 and to the gate electrode 27, respectively, as shown in FIG. 7. The contacts 40, 42, and 44 are also formed by photolithographic techniques, well known in the semiconductor device manufacturing art.

Figure 8:
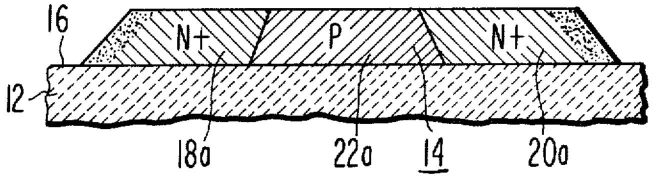
Figure 9:
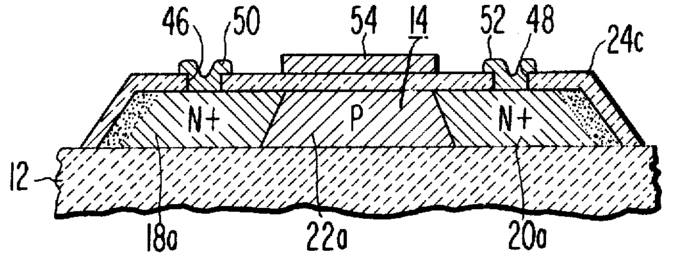

To make a FET with a metal gate, the insulating layer 24*b* (FIG. 4) is removed. Next, N+ source and drain regions 18*a* and 20*a* and channel region 22*a* are formed by any conventional photolithographic techniques, such as by the diffusion of a suitable dopant (phosphorus) into the mesa 14 from a gaseous or doped oxide source, or by ion implantation, as shown in FIG. 8. The mesa 14 is now oxidized to form an insulating layer 24*c*, as shown in FIG. 9, and openings 46 and 48 are formed over the source and drain regions 18*a* and 20*a* so that electrical contacts 50 and 52, respectively, can be made to these regions, as shown in FIG. 9. A metal gate electrode 54 is formed, and the electrical contacts 50 and 52 are made to the source and drain regions 18*a* and 20*a*, via the source and drain openings 46 and 48, respectively, by the vapor deposition of a metal, such as aluminum, which is then defined by photolithographic techniques (as shown in FIG. 9). The gate electrode 54 of aluminum can have a thickness of about 14000A.

FETs that have been treated to provide the aforementioned doped edge regions 32–35, adjacent to the side surfaces 36–39 of the mesa 14, have relatively lower source-drain leakage under zero bias conditions than FETs not so treated. Apparently, the selective doping of the edge regions 32–35 changes the physical and chemical properties of these regions. Our experimental results indicate that stabilized FETs, made in accordance with the present invention, have current leakage levels, at zero bias, of two or three orders of magnitude less than those devices without such edge stabilization. The amount of selective doping is limited by the desired or tolerated breakdown voltage of the FET; but it is possible to optimize this selective doping so that the breakdown voltage of the FET is maintained at a desired value while the aforementioned advantages of this selective doping are obtained. A carrier concentration of between about $5\times10^{16}cm^{-3}$ and $10^{19}cm^{-3}$ for the selective doped edge regions 32–35 of a conductivity type opposite to that of the source and drain regions is useful to stabilize FETs of the type described.

While the novel stabilized devices were described and illustrated by N-channel FETs it is also within the contemplation of the present invention to ion implant N type dopants into the regions adjacent the side surfaces of mesas of P-channel FETs to improve their stability with regards to leakage currents and threshold voltages.

What is claimed is:

1. A semiconductor device comprising:

a substrate of electrically insulating material, a mesa of single crystal semiconductor material on said substrate, said mesa having side surfaces extending transversely from said substrate, means defining a field effect transistor having source and drain regions and a channel region, said channel region extending between said source and drain regions and between two of said side surfaces, and
doped edge regions, in said channel region adjacent said two side surfaces of said channel region, having more conductivity modifiers than in the remainder of said channel region,
said conductivity modifiers being of the same conductivity type as that of said channel region.

2. A semiconductor device as described in claim 1 wherein:
said mesa of semiconductor material is silicon comprising said source and drain regions of one type conductivity separated by said channel region,
insulating material is over said regions, and
said doped edge regions have a carrier concentration of conductivity modifiers of between about $5\times10^{16}cm^{-3}$ and $10^{19}cm^{-3}$, said conductivity modifiers being of a type opposite to that of said source and drain regions.

3. A semiconductor device as described in claim 2 wherein:
said device is an enhancement N-channel FET and said conductivity modifiers are of a conductivity type opposite to that of said source and drain regions.

4. A semiconductor device as described in claim 1 wherein:
said device is an N-channel field-effect transistor,
said substrate is sapphire,
said mesa of semiconductor material is P type silicon having N type source and drain regions,
insulating material is over said regions,
a gate electrode is on said insulating material over said channel region including said two side surfaces of said channel region, and
said doped edge regions have a carrier concentration of conductivity modifiers of at least $5\times10^{16}cm^{-3}$ in said channel region, at least a portion of said conductivity modifiers being ion implanted.

5. A semiconductor device as described in claim 4 wherein:
said gate electrode is doped polysilicon,
said conductivity modifiers are of P type conductivity, whereby the threshold voltage at said doped edge regions is higher than the operating threshold voltage of said FET.

* * * * *